United States Patent
Verduijn et al.

(10) Patent No.: US 11,914,306 B2
(45) Date of Patent: Feb. 27, 2024

(54) PREDICTING DEFECT RATE BASED ON LITHOGRAPHIC MODEL PARAMETERS

(71) Applicant: Synopsys, Inc., Mountain View, CA (US)

(72) Inventors: Erik A. Verduijn, Leuven (BE); Ulrich Karl Klostermann, Munich (DE); Ulrich Welling, Aschheim/Dornach (DE); Jiuzhou Tang, Aschheim/Dornach (DE); Hans-Jürgen Stock, Dachau (DE)

(73) Assignee: Synopsys, Inc., Sunnyvale, CA (US)

( * ) Notice: Subject to any disclaimer, the term of this patent is extended or adjusted under 35 U.S.C. 154(b) by 180 days.

(21) Appl. No.: 17/072,568

(22) Filed: Oct. 16, 2020

(65) Prior Publication Data
US 2021/0116817 A1    Apr. 22, 2021

(30) Foreign Application Priority Data
Oct. 18, 2019    (EP) .................................... 19204192

(51) Int. Cl.
*G03F 7/00* (2006.01)
*G06F 30/23* (2020.01)
*G03F 7/004* (2006.01)
*G06F 17/15* (2006.01)

(52) U.S. Cl.
CPC .......... *G03F 7/7065* (2013.01); *G03F 7/0045* (2013.01); *G06F 17/15* (2013.01); *G06F 30/23* (2020.01)

(58) Field of Classification Search
CPC .......... G03F 7/0045; G03F 7/26; G03F 7/705; G03F 7/7065; G06F 17/15; G06F 30/23
See application file for complete search history.

(56) References Cited

U.S. PATENT DOCUMENTS

| | | | | |
|---|---|---|---|---|
| 2008/0243730 A1* | 10/2008 | Bischoff | ................ | G06N 20/00 706/12 |
| 2011/0239167 A1* | 9/2011 | Rathsack | ................ | G03F 7/705 716/50 |

FOREIGN PATENT DOCUMENTS

CN    110262191 A    *    9/2019    ............. G03F 7/705

OTHER PUBLICATIONS

Peter De Bisschop et al., "Stochastic printing failures in extreme ultraviolet lithography" Journal of Micro/Nanolithography, MEMS, and MOEMS, vol. 17, No. 4, Sep. 25, 2018.

(Continued)

*Primary Examiner* — Peter B Kim
(74) *Attorney, Agent, or Firm* — Park, Vaughan, Fleming & Dowler LLP; Laxman Sahasrabuddhe

(57) ABSTRACT

A calibrated lithographic model may be used to generate a lithographic model output based on an integrated circuit (IC) design layout. Next, at least a chemical parameter may be extracted from the lithographic model output. A calibrated defect rate model may then be used to predict a defect rate for the IC design layout based on the chemical parameter.

20 Claims, 8 Drawing Sheets

(56) References Cited

OTHER PUBLICATIONS

Van Pollentier et al., "Unraveling the EUV photoresist reactions: which, how much, and how do they relate to printing performance", Proceedings of SPIE ISSN 0277-786X, vol. 11323, Mar. 23, 2020.
Peter De Bisschop et al., "On the dependencies of the Stochastic Printing-Failure Cliffs in EUV Lithography", Proceedings of SPIE ISSN 0277-786X, vol. 10957, Mar. 26, 2019.
Erik Verduijn et al., "Prediction of EUV Stochastic Microbridge Probabilities by Lithography Simulations" Proc. SPIE 11323, Mar. 23, 2020.

* cited by examiner

| Term | Coefficient |
|---|---|
| Constant | -0.830086 |
| AImax_x_Dose-1 | -17.5207 |
| Inhmin | 6.58612 |
| InhILS-1 | 14.409 |
| AImax_x_Dose-1*AImax_x_Dose-1 | -16.8843 |
| AImax_x_Dose-1*Inhmin | 16.7326 |
| AImax_x_Dose-1*InhILS-1 | 16.7113 |
| Inhmin*Inhmin | -7.6663 |
| Inhmin*InhILS-1 | -7.19025 |
| InhILS-1*InhILS-1 | -6.43226 |

FIG. 2

| Term | Coefficient |
|---|---|
| Constant | -1.09734 |
| AImax_x_Dose-1 | -9.91141 |
| Inhmin | 12.2275 |
| InhILS-1 | 0.668272 |
| AImax_x_Dose-1*AImax_x_Dose-1 | -40.3448 |
| AImax_x_Dose-1*Inhmin | -21.5248 |
| AImax_x_Dose-1*InhILS-1 | 100.093 |
| Inhmin*Inhmin | 1.01302 |
| Inhmin*InhILS-1 | 19.5824 |
| InhILS-1*InhILS-1 | -62.047 |
| AImax_x_Dose-1*AImax_x_Dose-1*AImax_x_Dose-1 | -95.2799 |
| AImax_x_Dose-1*AImax_x_Dose-1*Inhmin | 86.2985 |
| AImax_x_Dose-1*AImax_x_Dose-1*InhILS-1 | 244.268 |
| AImax_x_Dose-1*Inhmin*Inhmin | -14.072 |
| AImax_x_Dose-1*Inhmin*InhILS-1 | -200.922 |
| AImax_x_Dose-1*InhILS-1*InhILS-1 | -176.241 |
| Inhmin*Inhmin*Inhmin | -7.01085 |
| Inhmin*Inhmin*InhILS-1 | 36.1829 |
| Inhmin*InhILS-1*InhILS-1 | 83.9151 |
| InhILS-1*InhILS-1*InhILS-1 | 42.5661 |

FIG. 3

IC design layout 502

Lithographic model output 602

PREDICTING DEFECT RATE BASED ON LITHOGRAPHIC MODEL PARAMETERS

RELATED APPLICATION

This application claims the benefit of European Patent Application No. EP19204192, filed on 18 Oct. 2019, the contents of which are herein incorporated by reference in their entirety for all purposes.

TECHNICAL FIELD

The present disclosure generally relates to integrated circuit (IC) design and manufacturing. More specifically, the present disclosure relates to predicting defect rate based on lithographic model parameters.

BACKGROUND

Advances in process technology and an increasing demand for computing and storage have fueled an increase in the size and complexity of IC designs. Such advances can be attributed to the improvements in semiconductor design and manufacturing technologies which have made it possible to integrate tens of millions of devices onto a single chip. It is important to accurately predict the defect rate before an IC layout is manufactured.

SUMMARY

Some embodiments described herein may use a calibrated lithographic model to generate a lithographic model output based on an IC design layout. Next, the embodiments may extract at least a chemical parameter from the lithographic model output. The embodiments may then use a calibrated defect rate model to predict a defect rate for the IC design layout based on the chemical parameter.

In some embodiments, the chemical parameter may correspond to inhibitor concentration. Specifically, the chemical parameter may relate to a dissolution rate of a resist during resist development.

Some embodiments may receive a set of IC design layouts, and defect rate measurements corresponding to the set of IC design layouts. Next, the embodiments may fit a defect rate model based on the set of IC design layouts and the defect rate measurements to obtain a calibrated defect rate model. In some embodiments, the defect rate model may include a complementary error function term. In some embodiments, the defect rate model may be a quadratic function. In some embodiments, the defect rate model may be a cubic function.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

FIG. 2 illustrates terms and coefficients in a quadratic model in accordance with some embodiments disclosed herein.

FIG. 3 illustrates terms and coefficients in a cubic model in accordance with some embodiments disclosed herein.

DETAILED DESCRIPTION

Figure 1:
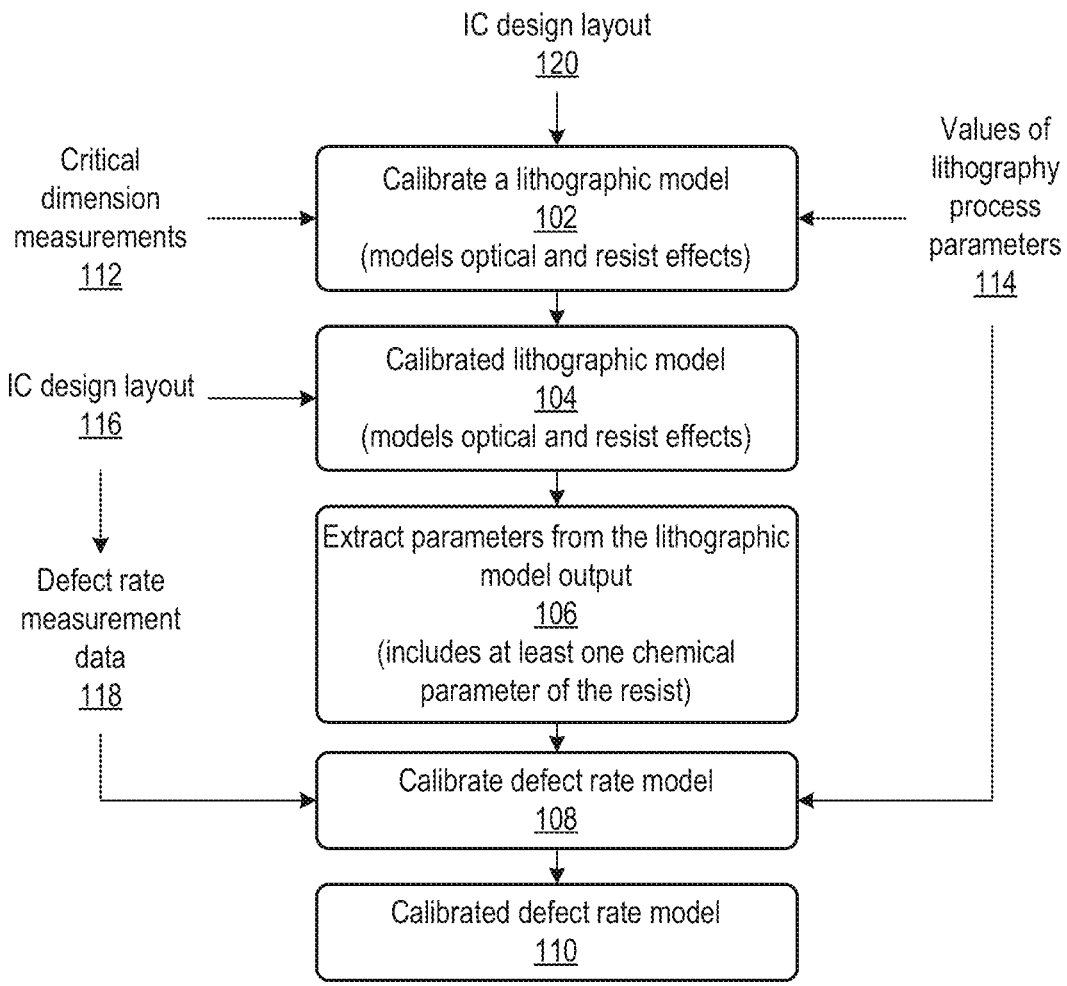
FIG. 1 illustrates a process for calibrating a defect rate model in accordance with some embodiments disclosed herein.

Defects, such as pinching and bridging, that occur during lithography may severely impact yield in a semiconductor manufacturing process. These defects may occur in a stochastic manner, and if even one of these defects occurs in a critical part of the IC chip, the entire IC chip may be rendered useless. It is important to predict the defect rate because an IC chip may include a large number of critical features.

The prediction accuracy of existing techniques is poor, and some techniques are unacceptably slow. Moreover, some existing techniques have a manual component, and are labor intensive.

Embodiments disclosed herein accurately and rapidly predict defect rates for a given lithography process. Advantages of embodiments described herein include, but are not limited to, enabling optimization of the manufacturability processes, thereby reducing the defect rates and improving the process costs and development time of a new device or technology.

Some embodiments disclosed herein predict defect rates based on one or more lithographic parameters, wherein at least one parameter is a chemical parameter related to the resist (e.g., the inhibitor concentration) that is extracted from a lithographic model output. In this disclosure, the term "lithographic model output" refers to an output of a lithographic model or simulator that calculates optical and resist effects of a lithography process.

According to one definition, the term "defect rate" refers to the probability of (1) a hole (i.e., absence of resist) occurring in an area where nominally (i.e., without stochastic events occurring) resist exists, or (2) resist occurring in an area where nominally (i.e., without stochastic events occurring) no resist exists.

When defect rate measurement data is collected, a different defect rate definition may be used that is more convenient from a metrology point of view. One defect rate metric that is used in the industry is called "PixNOK." This metric can be defined in the space area where there is nominally no resist, and the line area where there is nominally resist.

The "PixNOK" metric can be calculated in a space area of the IC design layout as follows. From a scanning electron microscope (SEM) image of a printed resist pattern, count the number of pixels which are "in failure" (i.e., have defects, e.g., micro-bridges) along the space area center-lines. Next, calculate the "PixNOK" metric by dividing the number of pixels which are "in failure" divided by the total number of pixels.

Likewise, the "PixNOK" metric can be calculated in a line area of the IC design layout as follows. From an SEM image of a printed resist pattern, count the number of pixels which are "in failure" (i.e., have defects, e.g., line breaks or holes) along the line area centerlines. Next, calculate the "PixNOK" metric by dividing the number of pixels which are "in failure" divided by the total number of pixels.

Note that the "PixNOK" metric corresponds to the defect rate because it empirically measures the number of pixels that have defects in the SEM image. Further details of this metric can be found in Bisschop, P. D., "Stochastic printing failures in extreme ultraviolet lithography," Journal of Micro/Nanolithography, MEMS, and MOEMS 17(4), 041011 (25 Sep. 2018).

FIG. 1 illustrates a process for calibrating a defect rate model in accordance with some embodiments disclosed herein.

The process may begin by calibrating a lithographic model that models optical and resist effects (102). In this disclosure, the term "lithographic model" refers to a software application that models optical and resist effects, i.e., the lithography model can be used to simulate or predict resist shapes that are expected to be printed on the wafer for a given IC design layout and a lithography process.

In general any existing lithographic model may be used. For example, the Sentaurus™ Lithography (S-Litho) simulator from Synopsys Inc., may be used. Certain parameters that characterize a lithography process may be provided as input to the lithographic model. For example, the lithographic model may receive the following lithography process parameters as input: exposure dose, optical focus, illumination, numerical aperture, mask stack parameters, resist parameters, and wafer stack parameters. As shown in FIG. 1, values of lithography process parameters 114 that correspond to the lithography process being used may be inputted into the lithography model.

The lithography model may include parameters that are fitted based on empirical data during calibration. In particular, resist development may be performed for one or more design layouts using the lithography process, and critical dimensions may be measured (e.g., by using SEM metrology) for various features in the IC design layout. Next, IC design layout 120 and the corresponding critical dimension measurements 112 can be used to calibrate the lithographic model, thereby obtaining calibrated lithographic model 104. Typically, multiple IC design layouts and their corresponding critical dimension measurements may be used to calibrate the lithographic model.

For a given IC design layout, e.g., IC design layout 116, calibrated lithographic model 104 (which models optical and resist effects) can accurately predict the resist shapes that are expected to be printed after resist development. Specifically, calibrated lithographic model 104 may include one or more computed parameters that model various physical and chemical phenomenon that occur during lithography. Specifically, the lithography model may include a computed parameter whose value at a given point can be used to determine whether resist is expected to print at that point. In some embodiments, the value of the computed parameter may be compared with a threshold value, and if the value is greater than the threshold value then the lithography model may determine that resist is expected to print, otherwise the lithography model may determine that resist is not expected to print. Specifically, the value of the computed parameter may be compared with the threshold over a two-dimensional plane to create contours of resist shapes that are expected to print.

To summarize, the lithographic model may include three types of parameters: (1) input parameters that are provided as input to the lithography model, and that correspond to characteristics (e.g., numerical aperture, etc.) of the lithography process, (2) fitted parameters (e.g., coefficients) that are fitted during calibration of the lithography model, and (3) computed parameters that are computed by the lithography model for a given IC design layout and lithography process during simulation or prediction, where the computed parameters may represent an effect of an optical and/or resist phenomenon that occurs during lithography. Specifically, in some embodiments, a lithographic model may use the parameters shown in the table below.

| Parameter Label | Parameter Description | Type | Correlation |
|---|---|---|---|
| Pitch | Design pitch | I | 0.042 |
| LW | Line width | M | 0.029 |
| D | Exposure dose | I | 0.850 |
| Focus | Exposure focus | I | 0.080 |
| CD | Measured space width | M | 0.403 |
| CDSim | Simulated Space CD | S | 0.490 |
| NILS | Normalized image log slope | S | 0.812 |
| ILS | Image log slope | S | 0.411 |
| AImin_x_Dose | Aerial Image minimum x Dose | S | 0.182 |
| AImax_x_Dose | Aerial Image maximum x Dose | S | 0.670 |
| AITresh_x_Dose | Aerial Image maximum x Dose | S | 0.150 |
| InhNILS | Inhibitor normalized image log slope | S | 0.885 |
| InhILS | Inhibitor image log slope | S | 0.596 |
| Imin | Inhibitor minimum | S | 0.888 |
| Imax | Inhibitor maximum | S | 0.181 |
| Ith | Inhibitor threshold | S | 0.554 |

In the above table, the column "Parameter Label" contains a label that may be used to refer to the parameter, and the column "Parameter Description" describes the parameter. The column "Type" specifies the type of the parameter. In particular, an "I" in the "Type" column indicates that the parameter is provided as input, an "M" indicates that the parameter is an empirical parameter that is measured, e.g., by using SEM metrology (measured parameters may be used for fitting the lithographic model). An "S" in the "Type" column indicates that the parameter is computed by the lithographic model based on the input parameters and the IC design layout. No fitted parameters are shown in the table.

A lithographic parameter may be correlated with the defect rate or the logarithm of the defect rate. Specifically, lithography may be performed on a set of IC design layouts to create resist shapes. Next, defects may be measured using SEM metrology to calculate the defect rate at different locations in each of the IC design layouts. The calculated defect rates may then be correlated with lithographic parameters, thereby identifying lithographic parameters that are good predictors of defect rate. In particular, the higher the correlation, the better the parameter is as a defect rate predictor.

The "Correlation" column provides the correlation between the parameter and the logarithm of "PixNOK," i.e., log(PixNOK). As can be seen from the above table, the "inhibitor minimum" has the highest correlation with log (PixNOK). The "inhibitor" parameter is a chemical concentration parameter of the resist which determines the dissolution rate of the resist during resist development. In some embodiments, this parameter may have a range [0, 1], where 0 corresponds to the maximum dissolution rate, and 1 corresponds to the minimum dissolution rate. Thus, a lower value of the inhibitor parameter at a point corresponds to a higher dissolution rate (which means that the resist is less likely to exist at that point). A lithographic model, e.g., S-Litho, may calculate the inhibitor concentration. The "inhibitor minimum" may be the minimum value of the inhibitor concentration along a line (e.g., a space-area or line-area centerline) in the IC design layout.

Correlations can also be calculated between functions of the lithographic parameters and defect rate. Some examples of functions of lithographic parameters and their correlations with the defect rate are shown in the table below.

| Parameter Label | Parameter Description | Type | Correlation |
|---|---|---|---|
| Combi1 | Imin/D | F | 0.923 |
| Combi2 | Imin/$D^2$ | F | 0.939 |
| Combi3 | Imin/$D^3$ | F | 0.945 |
| Combi4 | $Imin^{0.5}/D^3$ | F | 0.951 |
| Func1 | $A\log_{10}\left(\frac{1}{2}\mathrm{erfc}(B\cdot\mathrm{sign}\cdot(Ith-Imean))\cdot e^{C\cdot D}\right)$ | F | 0.958 |
| Func2 | Fitted quadratic model | F | 0.972 |
| Func3 | Fitted cubic model | F | 0.978 |

An "F" in the "Type" column indicates that the row corresponds to a function of one or more parameters. For example, the parameter "Combi1" is equal to Imin divided by dose D, the parameter "Combi2" is equal to Imin divided by the square of D, etc. The label "Func1" corresponds to the function shown in the "Parameter Description" column. In this function, the coefficients "A," "B," and "C" are fit to empirical data as explained below. Likewise, the functions in rows "Func2" and "Func3" are also explained in more detail below.

As can be seen from the above table, certain functions have very high correlation with the measured defect rate. Accordingly, some embodiments disclosed herein predict the defect rate based on a set of parameters, which includes at least a chemical parameter of the resist (e.g., the inhibitor concentration). In particular, some embodiments disclosed herein can use a function (e.g., one of the functions shown in the above table) defined over the set of parameters to predict the defect rate.

The function shown in the "Func1" row can be derived as follows. The inhibitor concentration after exposure and post exposure bake (PEB) may have statistical fluctuations caused by a variety of sources: photon noise, chemical composition fluctuations, etc. These fluctuations may all add up to create a normally distributed fluctuation in the inhibitor concentration around a mean value. At a given location in the resist, the probability density of there being an inhibitor concentration may be expressed as:

$$pdensity(I(x, y, z)) = \frac{1}{\sqrt{2\pi}\,\sigma} e^{-\left(\frac{I(x,y,z)-Imean(x,y,z)}{\sigma\sqrt{2}}\right)^2}$$

where I(x,y,z) is the inhibitor concentration (including random fluctuations) at point (x,y,z), Imean(x,y,z) is the mean inhibitor concentration at point (x,y,z), and a is the standard deviation of the inhibitor fluctuations. The value of Imean at a given location can be set to be equal to the inhibitor of the continuum resist model at that location. In other words, the value of the inhibitor concentration that the lithographic model (e.g., the one used in S-Litho) calculates at a given point in the IC design layout can be used as the value of Imean.

Above a certain inhibitor threshold, the resist will not develop, i.e., print. In the equation for "Fund," this value is "Ith." In other words, if fluctuations are ignored, then resist will print if the inhibitor value is greater than Ith, and the resist will not print if the inhibitor value is less than Ith.

However, the inhibitor fluctuates due to stochastic phenomenon. Thus, I(x,y,z) fluctuates around Imean. Where resist existed without fluctuations, a hole defect may appear in a line area if the fluctuations are high enough so that I(x,y,z)<Ith. On the other hand, where no resist existed, a printing defect may appear in a space area if the fluctuations are high enough that I(x,y,z)>Ith.

Adding statistical fluctuations can produce a metric of the defect failure rate. Specifically, the probability of an inhibitor value in a range dI around I is given by:

$$dp(I) = pdensity(I)dI = \frac{dI}{\sqrt{2\pi}\sigma} e^{-\left(\frac{I-Imean}{\sigma\sqrt{2}}\right)^d}$$

The probability of a printing defect in a space area can be calculated as follows:

$$Pdefpr = \int_{Ith}^{\infty} dp(I)$$
$$= \frac{1}{2}\left(1 - \int_{Imean-Ith}^{Imean+Ith} dp(I)\right)$$
$$= \frac{1}{2}\left(1 - \int_{Imean-Ith}^{Imean+Ith} \frac{dI}{\sqrt{2\pi}\,\sigma} e^{-\left(\frac{I-Imean}{\sigma\sqrt{2}}\right)^2}\right)$$

Thus, the probability of a defect can be expressed using the complementary error function, erfc, as follows:

$Pdef=1/2\,erfc(\mathrm{sign.}\ y)$ where, $$y = \frac{\Delta Ith}{\sigma\sqrt{2}},$$

$\Delta Ith = Ith - Imean$ sign=+1 for a print defect and −1 for a hole defect, and erfc is the complementary error function.

Using a calibrated resist model, the simulated Imin for a line-space pattern was compared with the exposure dose D for a range of representative pitches and space widths. Based on the comparison, it was observed that the inhibitor concentration/minimum is a function of the exposure dose D. In other words, the standard deviation of the inhibitor minimum is a function of the dose and its standard deviation (this is how the dose enters the expression for the defect prediction). Specifically, an exponential function provides a good fit for the variation of inhibitor concentration/minimum with respect to the exposure dose D. Thus, $Imin = \alpha e^{-\beta D}$ $\sigma_{Imin} = \sigma(\alpha e^{-\beta D}) = f(\sigma_D, D)$ where the value of $f(\sigma_D, D)$ can be obtained by error propagation. Specifically, it can be shown using error propagation that:

$$\sigma_{Imin} = \beta \cdot I \cdot \sigma_D = \alpha\beta \cdot e^{\beta D} \cdot \sigma_D$$

Using the above expression in the defect rate equation, and taking the logarithm of the defect rate, gives:

$$\log_{10}(Pdef) = \log_{10}\left(\frac{1}{2}\text{erfc}\left(\text{sign} \cdot \frac{Ith - Imean}{\alpha\beta \cdot e^{-\beta D} \cdot \sigma_D \sqrt{2}}\right)\right)$$

We arrive at the equation shown for "Func1" by assuming that the experimentally measured defect rate log(PixNOK) is proportional to the theoretically derived defect rate:

$$\log_{10}(PixNOK) = A \log_{10}(1/2 \text{erfc}(B \cdot \text{sign} \cdot (Ith - Imean)) \cdot e^{C \cdot D})$$

In the above equation, the coefficients "A," "B," and "C" can be fit by using empirical data. For example, (1) SEM metrology may be used to measure defect rate data by printing a set of IC design layouts using a lithography process, (2) the IC design layouts may be simulated using a calibrated lithographic model, and the Ith and Imean values may be extracted from the lithographic model, and (3) the coefficients "A," "B," and "C" may be determined from the best fit when the measured defect rate (e.g., PixNOK), Ith, and Imean values are plugged into the equation. For example, the values 6.49, 0.68, and 0.069 were obtained for A, B, and C for a particular lithographic process.

In general, any function may be used to predict the defect rate based on the parameters. For example, a quadratic function that that is defined over the parameters may be used as the prediction function (this corresponds to the "Func2" row in the parameter table), where each term of the quadratic function has a degree of at most two.

FIG. 2 illustrates terms and coefficients in a quadratic model in accordance with some embodiments disclosed herein.

Alternatively, a cubic function that that is defined over the parameters may be used as the prediction function (this corresponds to the "Func3" row in the parameter table), where each term of the cubic function has a degree of at most three.

FIG. 3 illustrates terms and coefficients in a cubic model in accordance with some embodiments disclosed herein.

Referring back to FIG. 1, IC design layout 116 may be provided to calibrated lithographic model 104. IC design layout 116 may also be printed using a lithography process, and defect rate measurement data 118 may be obtained. Alternatively, defect rate measurement data 118 may also be obtained by performing a computationally costly and detailed Monte Carlo simulation of the lithography process.

Next, parameters may be extracted from the lithographic model output (106), where the extracted parameters includes at least one chemical parameter of the resist. The defect rate model may then be calibrated based on the extracted parameters and the defect rate measurement data 118, thereby obtaining calibrated defect rate model 110.

Figure 4:
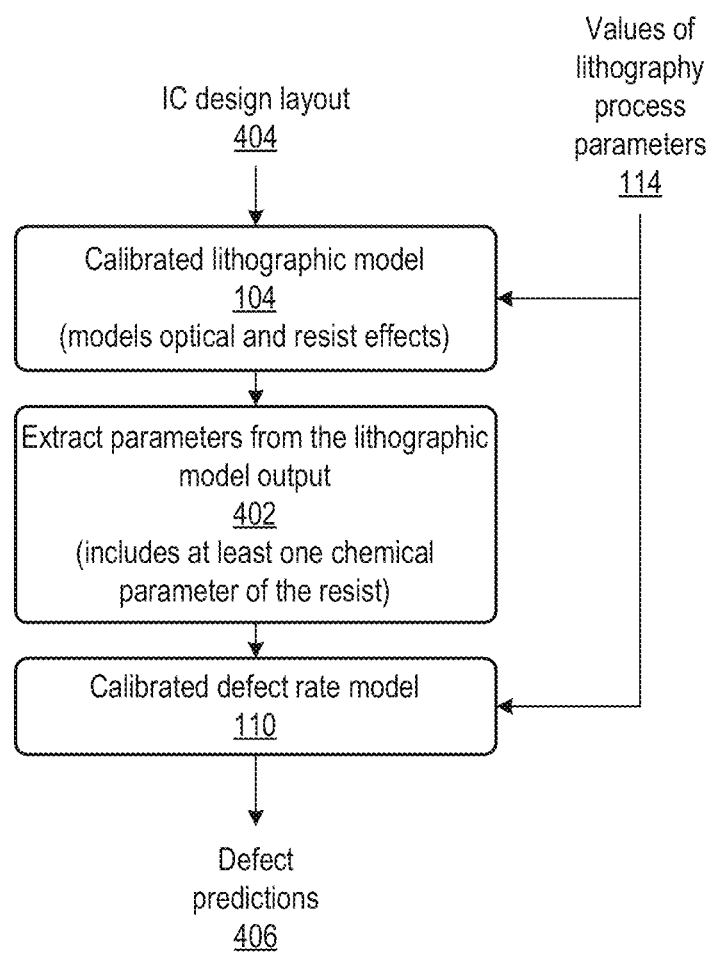
FIG. 4 illustrates a process for predicting the defect rate using a calibrated defect rate model in accordance with some embodiments disclosed herein.

FIG. 4 illustrates a process for predicting the defect rate using a calibrated defect rate model in accordance with some embodiments disclosed herein.

The process may begin by providing IC design layout 404 and values of lithography process parameters 114 to calibrated lithographic model 104. Next, the process may extract parameters from the lithographic model output (402), where the extracted parameters may include at least one chemical parameter of the resist. The process may then provide the extracted parameters and values of lithography process parameters 114 to calibrated defect rate model 110. Calibrated defect rate model 110 may then generate defect predictions 406 based on the extracted parameters and values of lithography process parameters 114.

In some embodiments, defect prediction 406 may include two defect maps: (1) a first map for the case (Ith−Imean)>0, i.e., the case when a printing defect is created in a space area, and (2) a second map for the case (Ith−Imean)<0, i.e., the case when a hole defect is created in a resist area.

Figure 5:
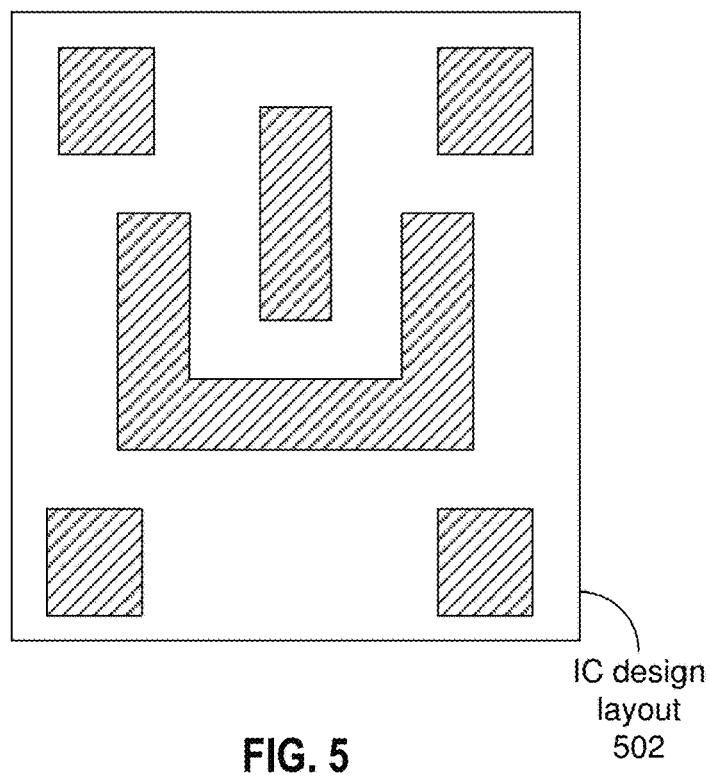
FIG. 5 illustrates an IC design layout in accordance with some embodiments disclosed herein.

FIG. 5 illustrates an IC design layout in accordance with some embodiments disclosed herein. The shaded areas in IC design layout 502 correspond to areas where a resist is desired to be printed, and the clear areas correspond to areas where no resist should exist.

Figure 6:
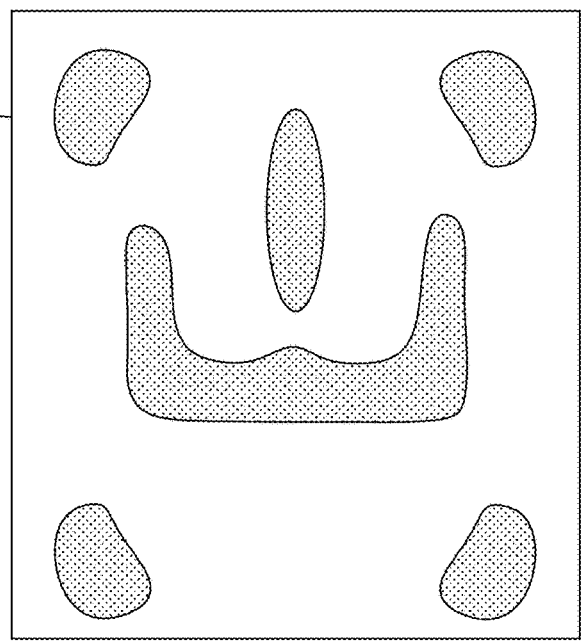
FIG. 6 illustrates a lithographic model output in accordance with some embodiments disclosed herein.

FIG. 6 illustrates a lithographic model output in accordance with some embodiments disclosed herein. The shaded areas in lithographic model output 602 illustrate the resist patterns predicted by the calibrated lithographic model.

Figure 7:
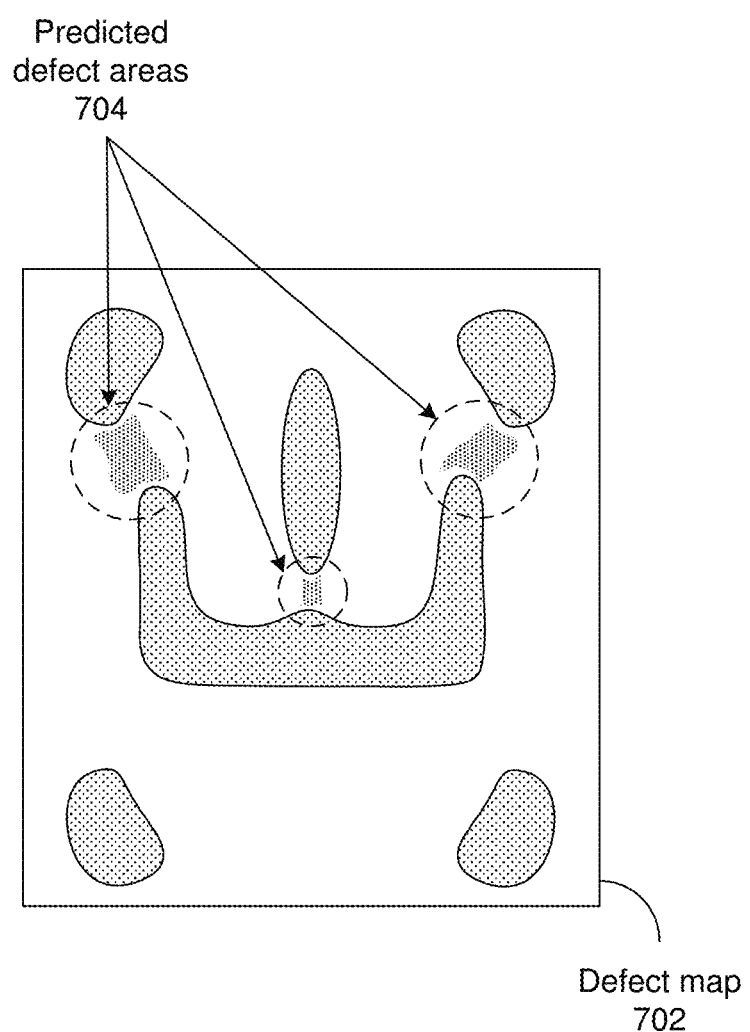
FIG. 7 illustrates a defect map in accordance with some embodiments disclosed herein.

FIG. 7 illustrates a defect map in accordance with some embodiments disclosed herein. Defect map 702 includes the predicted resist patterns, and additionally predict areas where a defect is likely to occur. For example, defect map 702 includes predicted defect areas 704 where a printed defect is likely to occur.

Figure 8:
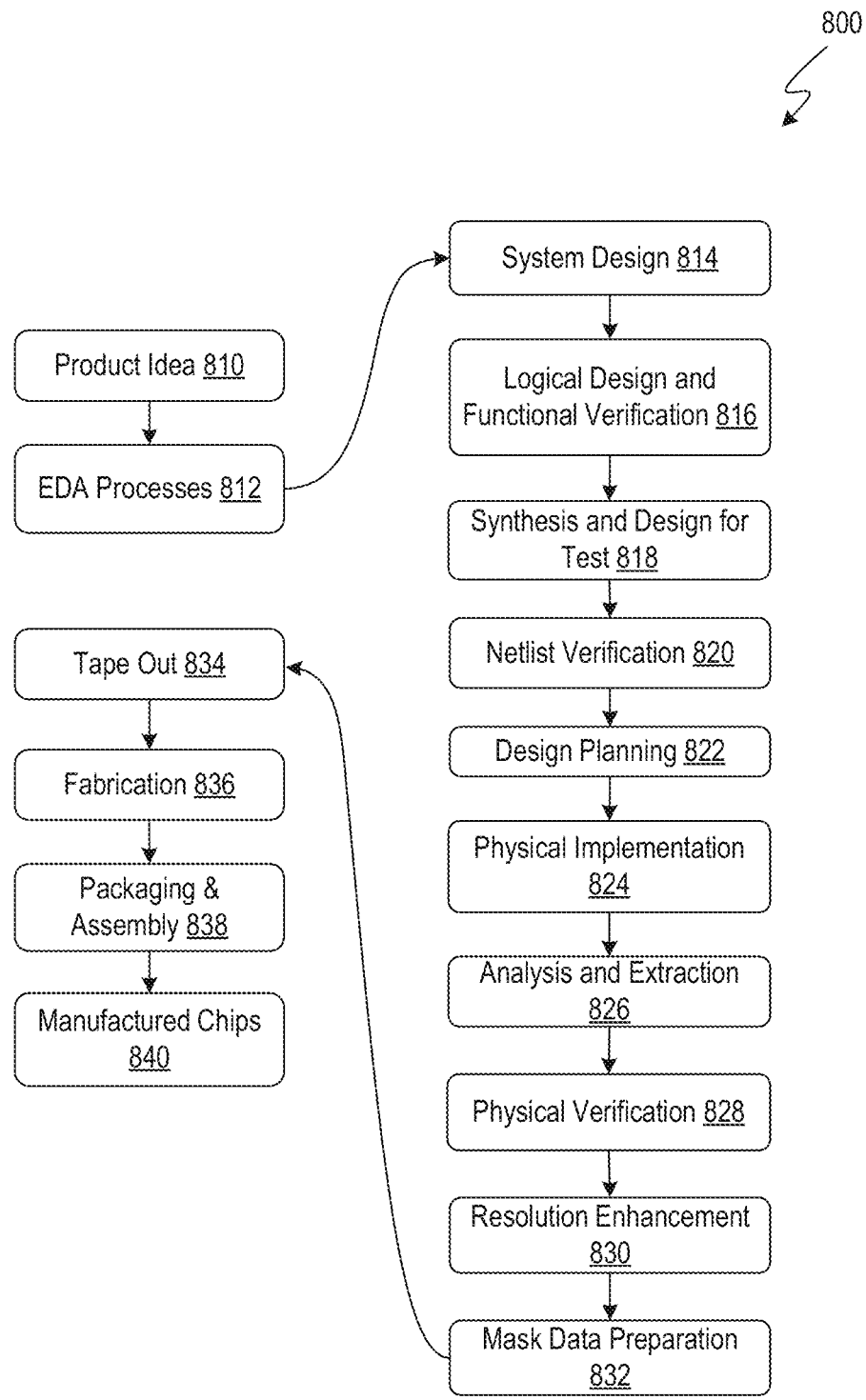
FIG. 8 illustrates an example flow for the design, verification, and fabrication of an integrated circuit in accordance with some embodiments described herein.

FIG. 8 illustrates an example flow 800 for the design, verification, and fabrication of an integrated circuit in accordance with some embodiments described herein.

EDA processes 812 (the acronym "EDA" refers to "Electronic Design Automation") can be used to transform and verify design data and instructions that represent the integrated circuit. Each of these processes can be structured and enabled as multiple modules or operations.

Flow 800 can start with the creation of a product idea 810 with information supplied by a designer, information which is transformed and verified by using EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly 838 are performed to produce the manufactured IC chip 840.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 in FIG. 9) may be used to store the programs and data structures that are used by some or all of the EDA products described herein, and products used for development of cells for the library and for physical and logical design that use the library.

Figure 9:
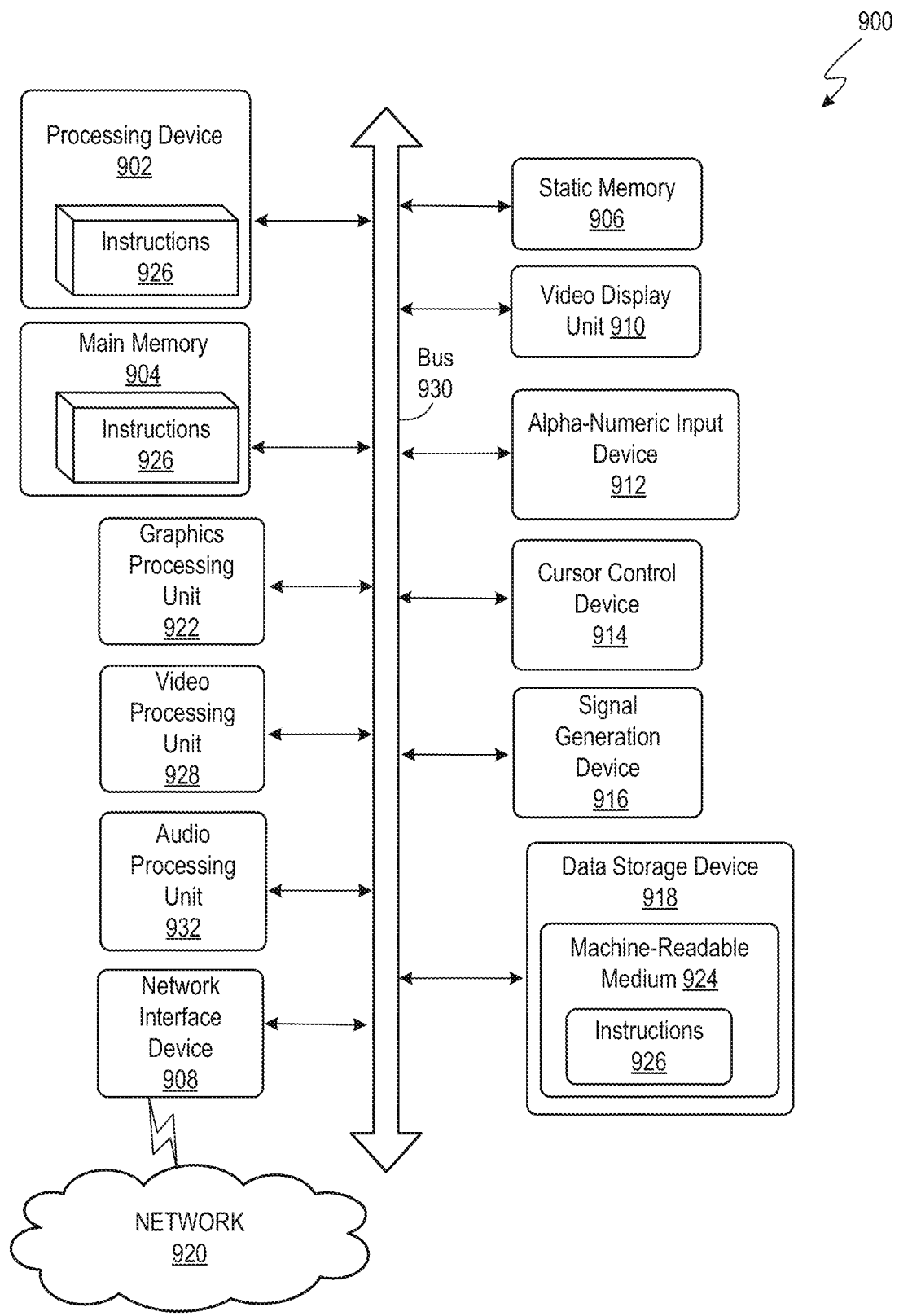
FIG. 9 illustrates an example machine of a computer system within which a set of instructions, for causing the machine to perform any one or more of the methodologies discussed herein, may be executed.

FIG. 9 illustrates an example machine of a computer system 900 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
using a calibrated lithographic model to generate a lithographic model output based on simulating a lithography process for an integrated circuit (IC) design layout;
extracting, by a processor, at least a chemical parameter from the lithographic model output, wherein the chemical parameter is an inhibitor concentration; and
using a calibrated defect rate model to predict a defect rate for the IC design layout based on the chemical parameter.

2. The method of claim 1, wherein the inhibitor concentration is a minimum inhibitor concentration along a line in the IC design layout.

3. The method of claim 1, wherein the chemical parameter relates to a dissolution rate of a resist during resist development.

4. The method of claim 1, comprising:
receiving a set of IC design layouts;
receiving defect rate measurements for the set of IC design layouts; and
fitting a defect rate model based on the set of IC design layouts and the defect rate measurements to obtain the calibrated defect rate model.

5. The method of claim 4, wherein the defect rate model includes a complementary error function term.

6. The method of claim 4, wherein the defect rate model is a quadratic function.

7. The method of claim 4, wherein the defect rate model is a cubic function.

8. A non-transitory computer readable storage medium storing instructions, which when executed by a processor, cause the processor to:
use a calibrated lithographic model to generate a lithographic model output based on simulating a lithography process for an integrated circuit (IC) design layout;
extract at least a chemical parameter from the lithographic model output, wherein the chemical parameter is an inhibitor concentration; and use a calibrated defect rate model to predict a defect rate for the IC design layout based on the chemical parameter.

9. The non-transitory computer readable storage medium of claim 8, wherein the inhibitor concentration is a minimum inhibitor concentration along a line in the IC design layout.

10. The non-transitory computer readable storage medium of claim 8, wherein the chemical parameter relates to a dissolution rate of a resist during resist development.

11. The non-transitory computer readable storage medium of claim 8, wherein the instructions, which when executed by the processor, cause the processor to:
receive a set of IC design layouts;
receive defect rate measurements for the set of IC design layouts; and
fit a defect rate model based on the set of IC design layouts and the defect rate measurements to obtain the calibrated defect rate model.

12. The non-transitory computer readable storage medium of claim 11, wherein the defect rate model includes a complementary error function term.

13. The non-transitory computer readable storage medium of claim 11, wherein the defect rate model is a quadratic function.

14. The non-transitory computer readable storage medium of claim 11, wherein the defect rate model is a cubic function.

15. An apparatus, comprising:
a memory storing instructions; and
a processor, coupled with the memory and to execute the instructions, the instructions when executed causing the processor to:
use a calibrated lithographic model to generate a lithographic model output based on simulating a lithography process for an integrated circuit (IC) design layout;
extract at least a chemical parameter from the lithographic model output, wherein the chemical parameter is an inhibitor concentration; and
use a calibrated defect rate model to predict a defect rate for the IC design layout based on the chemical parameter.

16. The apparatus of claim 15, wherein the inhibitor concentration is a minimum inhibitor concentration along a line in the IC design layout.

17. The apparatus of claim 15, wherein the chemical parameter relates to a dissolution rate of a resist during resist development.

18. The apparatus of claim 15, wherein the instructions, which when executed by the processor, cause the processor to:
receive a set of IC design layouts;
receive defect rate measurements for the set of IC design layouts; and
fit a defect rate model based on the set of IC design layouts and the defect rate measurements to obtain the calibrated defect rate model.

19. The apparatus of claim 17, wherein the defect rate model includes a complementary error function term.

20. The apparatus of claim 17, wherein the defect rate model is a quadratic function or a cubic function.

* * * * *